(12) United States Patent
Park et al.

(10) Patent No.: US 10,825,531 B1
(45) Date of Patent: Nov. 3, 2020

(54) SEMICONDUCTOR MEMORY DEVICE INCLUDING PAGE BUFFERS

(71) Applicant: SK hynix Inc., Icheon-si (KR)

(72) Inventors: Tae Sung Park, Icheon-si (KR); Dong Hyuk Kim, Seoul (KR); Sung Lae Oh, Cheongju-si (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/723,899

(22) Filed: Dec. 20, 2019

(30) Foreign Application Priority Data

Aug. 1, 2019 (KR) .......................... 10-2019-0093899

(51) Int. Cl.
*G11C 16/16* (2006.01)
*G11C 7/10* (2006.01)
*G11C 7/18* (2006.01)
*G11C 16/24* (2006.01)

(52) U.S. Cl.
CPC ............ *G11C 16/16* (2013.01); *G11C 7/1084* (2013.01); *G11C 7/1087* (2013.01); *G11C 7/18* (2013.01); *G11C 16/24* (2013.01)

(58) Field of Classification Search
CPC ...... G11C 11/5635; G11C 16/16; G11C 16/14
See application file for complete search history.

(56) References Cited

U.S. PATENT DOCUMENTS

2019/0371408 A1* 12/2019 Yu ......................... G11C 16/14
2019/0385681 A1* 12/2019 Yun .................... G11C 16/0483

FOREIGN PATENT DOCUMENTS

| KR | 10-2010-0055104 A | 5/2010 |
| KR | 10-2015-0002000 A | 1/2015 |

* cited by examiner

*Primary Examiner* — Han Yang

(57) ABSTRACT

A semiconductor memory device includes a memory cell array; and a page buffer circuit coupled to the memory cell array through a plurality of bit lines which extend in a second direction intersecting with a first direction. The page buffer circuit includes a plurality of bit line select transistors coupled to the plurality of bit lines; a plurality of latches coupled to the plurality of bit line select transistors, respectively; and a plurality of erase bias pass transistors coupled to the plurality of bit lines, and configured to transfer an erase voltage to the bit lines. The plurality of erase bias pass transistors and the plurality of bit line select transistors are disposed in different regions, and are not adjacent to each other.

20 Claims, 20 Drawing Sheets

M2_Verase

SEMICONDUCTOR MEMORY DEVICE INCLUDING PAGE BUFFERS

CROSS-REFERENCE TO RELATED APPLICATION

The present application claims priority under 35 U.S.C. § 119(a) to Korean Patent Application No. 10-2019-0093899 filed in the Korean Intellectual Property Office on Aug. 1, 2019, which is incorporated herein by reference in its entirety.

BACKGROUND

1. Technical Field

Various embodiments generally relate to a semiconductor memory device, and particularly, to a semiconductor memory device including page buffers.

2. Related Art

As the demand for portable phones, mobile memory devices and digital cameras increases, the demand for nonvolatile memory devices used in these products also increases. Among nonvolatile memory devices, a NAND flash memory device is widely used as a data storage device. The NAND flash memory device includes a plurality of page buffers which are coupled to bit lines, and performs an operation necessary to read and output data stored in memory cells, by using the plurality of page buffers.

SUMMARY

In an embodiment, a semiconductor memory device may include: a memory cell array; and a page buffer circuit coupled to the memory cell array through a plurality of bit lines which extend in a second direction intersecting with a first direction. The page buffer circuit may include: a plurality of bit line select transistors coupled to the plurality of bit lines; a plurality of latches coupled to the plurality of bit line select transistors, respectively; and a plurality of erase bias pass transistors coupled to the plurality of bit lines, and configured to transfer an erase voltage to the bit lines. The plurality of erase bias pass transistors and the plurality of bit line select transistors may be disposed in different regions, and may not be adjacent to each other.

In an embodiment, a semiconductor memory device may include: a page buffer circuit disposed on a substrate; and a memory cell array disposed on a source plate over the page buffer circuit, and coupled to the page buffer circuit through a plurality of bit lines extending in a second direction intersecting with a first direction. The page buffer circuit may include: a plurality of bit line select transistors coupled to the plurality of bit lines; a plurality of latches coupled to the plurality of bit line select transistors; and a plurality of erase bias pass transistors coupled to the plurality of bit lines, and configured to transfer an erase voltage to the bit lines. The plurality of erase bias pass transistors and the plurality of bit line select transistors may be disposed in different regions, and may not be adjacent to each other.

In an embodiment, a semiconductor memory device may include: a cell wafer including a memory cell array, and first pads which are coupled to the memory cell array through a plurality of bit lines extending in a second direction intersecting with a first direction; and a peripheral wafer including a page buffer circuit and second pads which are coupled to the page buffer circuit, and bonded onto the cell wafer such that the second pads are coupled with the first pads. The page buffer circuit may include: a plurality of bit line select transistors coupled to the plurality of bit lines; a plurality of latches coupled to the plurality of bit line select transistors; and a plurality of erase bias pass transistors coupled to the plurality of bit lines, and configured to transfer an erase voltage to the bit lines. The plurality of erase bias pass transistors and the plurality of bit line select transistors may be disposed in different regions, and may not be adjacent to each other.

DETAILED DESCRIPTION

Figure 1:
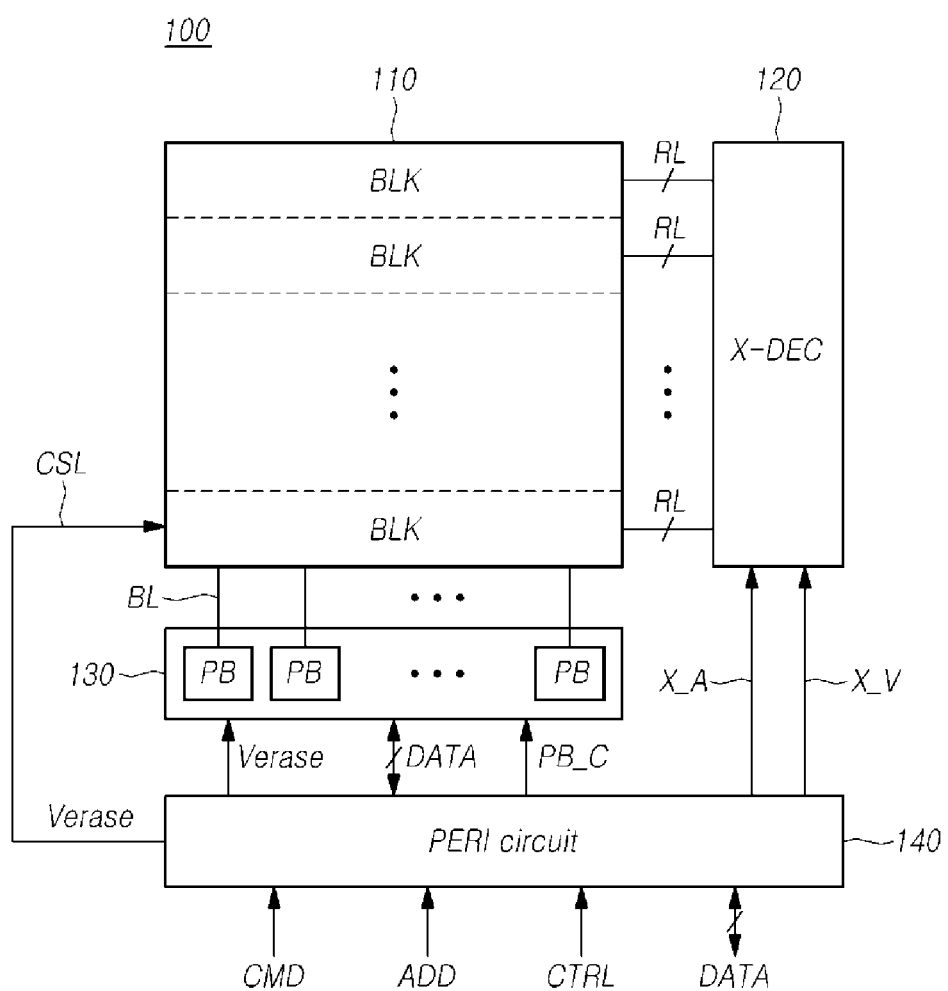
FIG. 1 is a block diagram illustrating a representation of an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

In embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device including page buffers will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 120, a page buffer circuit 130 and a peripheral circuit (PERI circuit) 140.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of the semiconductor memory device 100, it is to be understood that the technical spirit of the disclosure is not limited thereto.

The memory cell array 110 may be coupled to the row decoder 120 through row lines RL. The row lines RL may include at least one drain select line, a plurality of word lines and at least one source select line. The memory cell array 110 may be coupled to the page buffer circuit 130 through bit lines BL.

The row decoder 120 may select any one among the memory blocks BLK included in the memory cell array 110, in response to a row address X_A provided from the peripheral circuit 140. The row decoder 120 may transfer an operating voltage X_V, provided from the peripheral circuit 140, to row lines RL coupled to a memory block BLK selected among the memory blocks BLK included in the memory cell array 110. An erase operation of the semiconductor memory device 100 may be performed by an unit of memory block BLK. When an erase voltage Verase is applied to the channels of memory cells in the erase operation, the row decoder 120 may select at least one of the memory blocks BLK in response to the row address X_A provided from the peripheral circuit 140.

The page buffer circuit 130 may include a plurality of page buffers PB which are coupled to the bit lines BL, respectively. The page buffer circuit 130 may receive a page buffer control signal PB_C from the peripheral circuit 140, and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from memory cells which are coupled to an activated word line.

The page buffer circuit 130 may apply the erase voltage Verase, provided from the peripheral circuit 140, to the bit lines BL in an erase operation, and thereby, may transfer the erase voltage Verase to the channels of the memory cells of the memory cell array 110.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages which are required in the semiconductor memory device 100, by using an external voltage supplied to the semiconductor memory device 100.

The peripheral circuit 140 may include a plurality of pumping capacitors, and may generate a plurality of voltages by selectively activating the plurality of pumping capacitors. The plurality of voltages may include the operating voltage X_V and the erase voltage Verase.

The peripheral circuit 140 may be coupled to the memory cell array 110 through a common source line CSL. The peripheral circuit 140 may apply the erase voltage Verase to the common source line CSL in the erase operation, and accordingly, may provide the erase voltage Verase to the channels of the memory cells of the memory cell array 110.

The peripheral circuit 140 may provide the erase voltage Verase to the page buffer circuit 130 in the erase operation. When the erase voltage Verase is applied to the channels of the memory cells through the common source line CSL in the erase operation, the peripheral circuit 140 may control the page buffer circuit 130 to apply the erase voltage Verase to the channels of the memory cells through the bit lines BL, thereby increasing erase efficiency.

Hereinbelow, in the accompanying drawings, two directions that are parallel to the top surfaces of a substrate or/and a source plate and intersect with each other are defined as a first direction FD and a second direction SD, respectively, and a direction that vertically projects from the top surfaces of the substrate or/and the source plate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
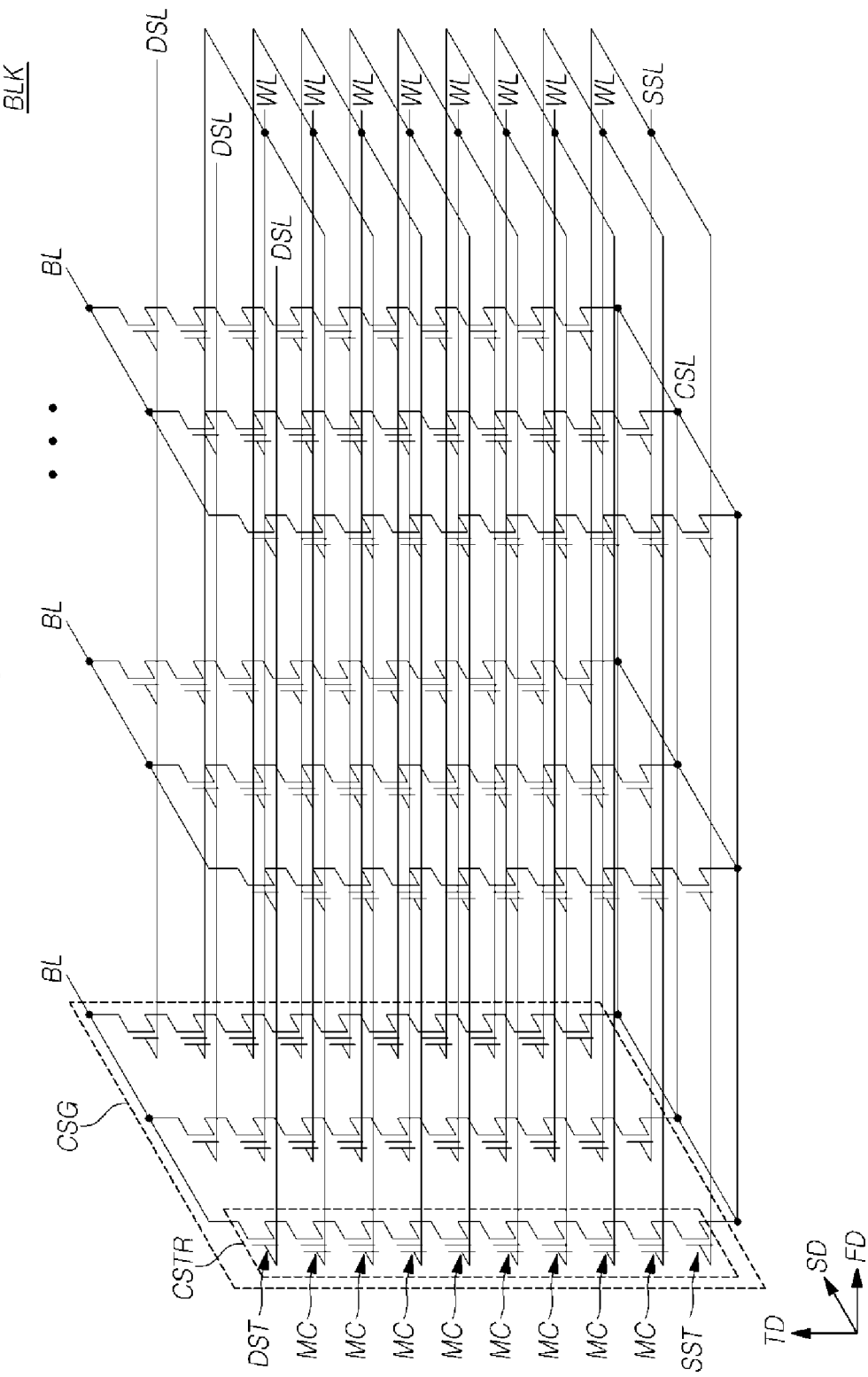
FIG. 2 is an equivalent circuit diagram illustrating an example of one of memory block illustrated in FIG. 1 in accordance with an embodiment of the disclosure.

FIG. 2 is an equivalent circuit diagram illustrating an example of one of the memory blocks BLK illustrated in FIG. 1 in accordance with an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be disposed between the bit lines BL and the common source line CSL in the third direction TD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page. Cell strings CSTR which are coupled in common to one bit line BL may constitute one cell string group CSG.

Figure 3:
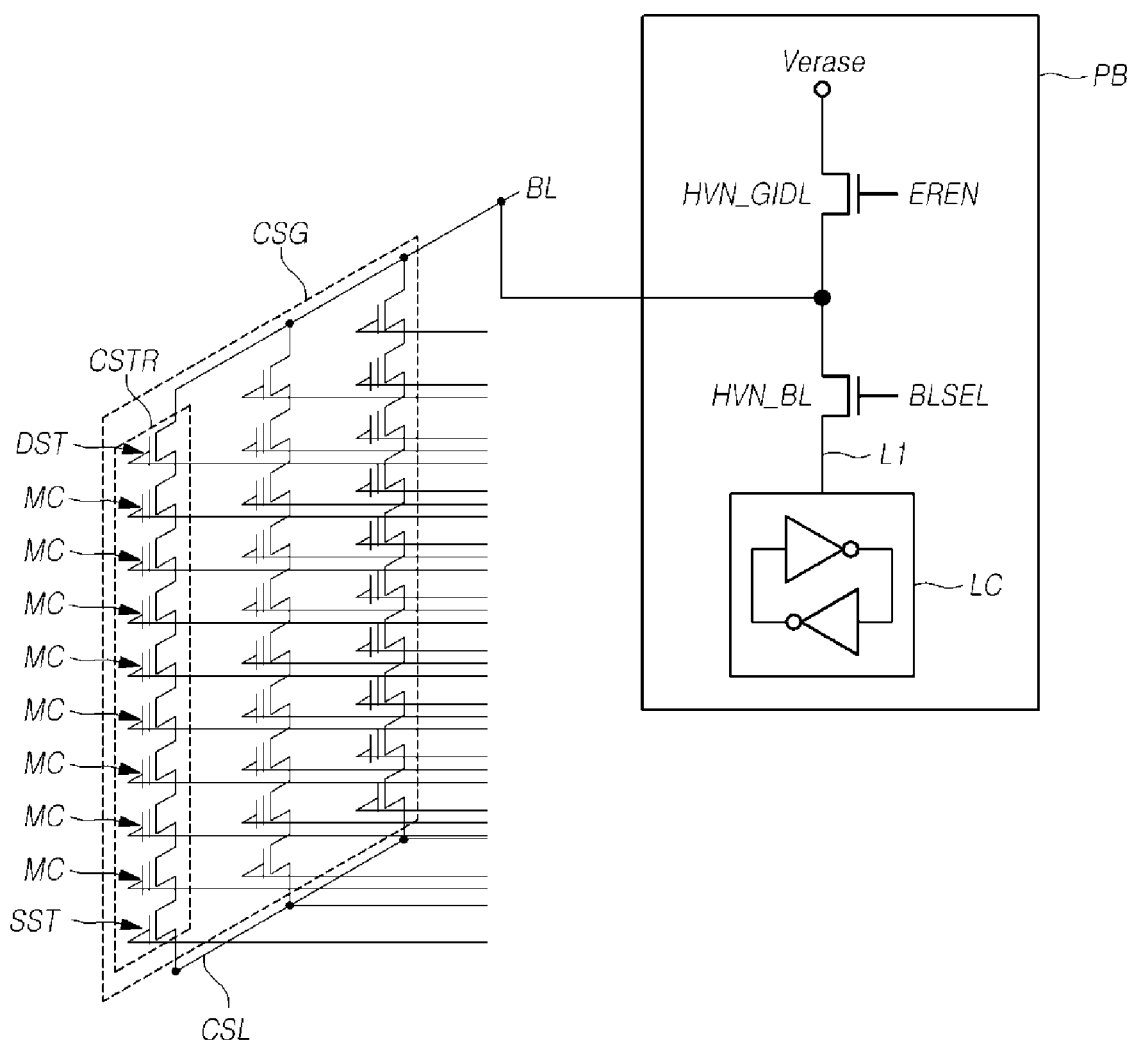
FIG. 3 is a circuit diagram illustrating a cell string group and a page buffer in accordance with an embodiment of the disclosure.

FIG. 3 is a circuit diagram illustrating a cell string group CSG and a page buffer PB coupled thereto.

Referring to FIG. 3, the page buffer PB may be coupled to the cell string group CSG through a bit line BL. The page buffer PB may include a bit line select transistor HVN_BL, a latch LC, and an erase bias pass transistor HVN_GIDL.

The bit line select transistor HVN_BL may be coupled between the bit line BL and a line L1, and may operate in response to a bit line select signal BLSEL. When the bit line select signal BLSEL is activated, the bit line select transistor HVN_BL may couple the bit line BL and the line L1. When the bit line select signal BLSEL is deactivated, the bit line select transistor HVN_BL may decouple the bit line BL and the line L1.

The latch LC may apply a voltage to the line L1 based on data stored therein. The voltage applied to the line L1 may be transferred to the bit line BL through the bit line select transistor HVN_BL. The latch LC may perform a latch based on the voltage of the line L1. The latch may be performed based on a voltage transferred to the line L1 through the bit line select transistor HVN_BL from the bit line BL.

The erase bias pass transistor HVN_GIDL may be coupled between an erase voltage Verase and the bit line BL, and may operate in response to an erase enable signal EREN. When the erase enable signal EREN is activated, the erase bias pass transistor HVN_GIDL may couple the erase voltage Verase and the bit line BL. When the erase enable signal EREN is deactivated, the erase bias pass transistor HVN_GIDL may decouple the erase voltage Verase and the bit line BL.

The erase voltage Verase having a relatively high level or magnitude may be applied to the bit line select transistor HVN_BL and the erase bias pass transistor HVN_GIDL. In order to withstand the high voltage, the bit line select transistor HVN_BL and the erase bias pass transistor HVN_GIDL may be configured using high voltage elements. In an erase operation, the bit line select signal BLSEL may be deactivated. Due to this fact, a high voltage applied to the bit line BL may be blocked by the bit line select transistor HVN_BL, and may not be transferred to the latch LC. Elements constituting the latch LC may be configured with low voltage elements.

Figure 4:
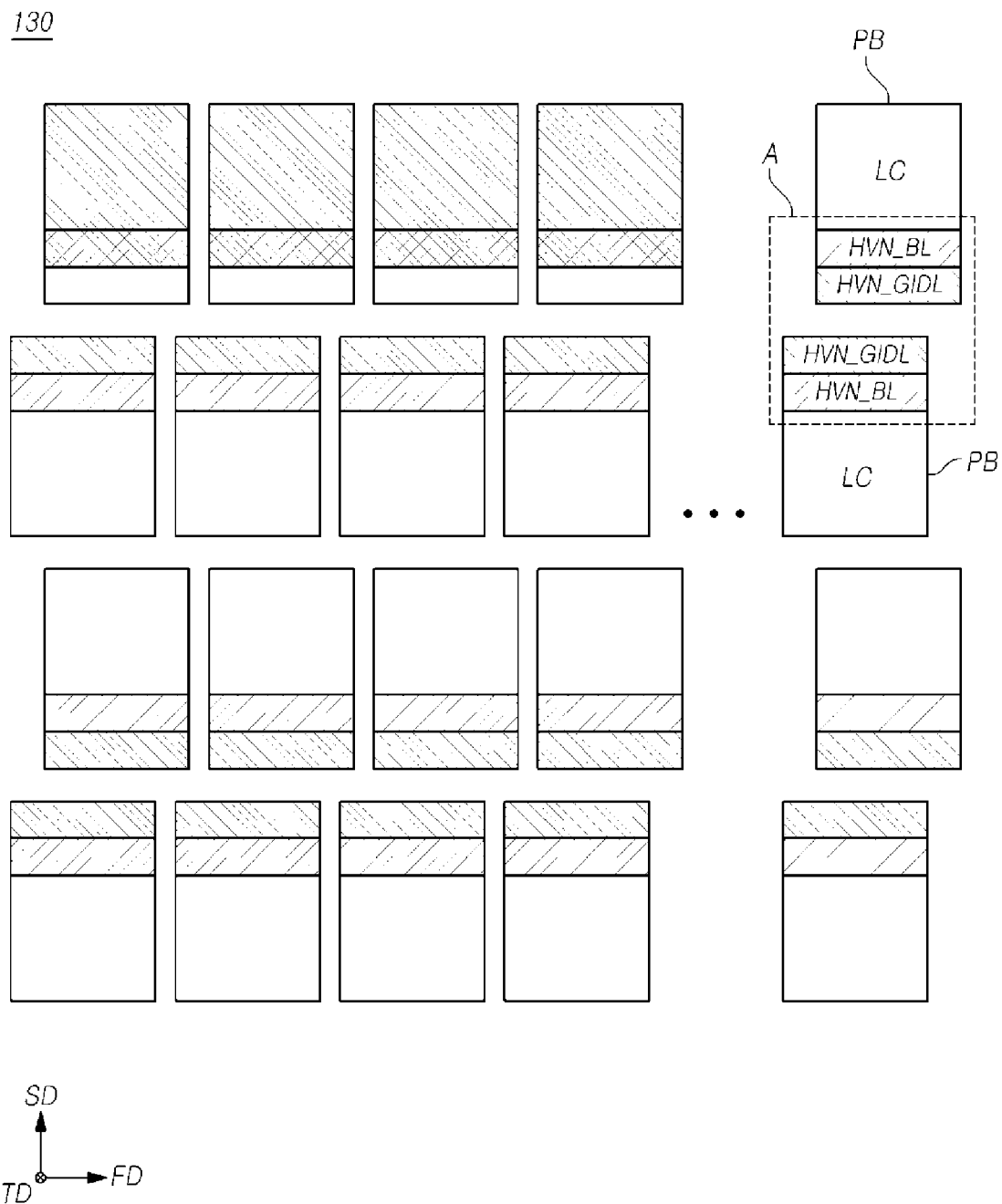
FIG. 4 is a top view illustrating an example of a schematic layout of page buffer circuits of the disclosure.

FIG. 4 is a top view schematically illustrating an example of a layout of page buffer circuits of a semiconductor memory device of the disclosure.

Referring to FIG. 4, latches LC are spaced apart and disposed in a plurality of rows extending in the first direction. Rows of latches LC are spaced apart in the second direction SD such that the rows are substantially parallel to bit lines. The rows of latches LC may be slightly offset such that columns of latches LC extending in the second direction SD are slightly staggered in relation to each other. The page buffer circuits are arranged such that, in two adjacent rows of latches LC, two rows of bit line select transistors HVN_BL are disposed between the two adjacent rows of the latches LC, and two rows of erase bias pass transistors HVN_GIDL are disposed between the two adjacent rows of the bit line select transistors HVN_BL. Thus, two bit line select transistors HVN_BL and two erase bias pass transistors HVN_GIDL are disposed between a pair of latches LC in the second direction SD. One latch LC, one bit line select transistor HVN_BL and one erase bias pass transistor HVN_GIDL may constitute one page buffer PB. The latches LC, the bit line select transistors HVN_BL and the erase bias pass transistors HVN_GIDL are disposed in the units of page buffers PB.

Figure 5A:
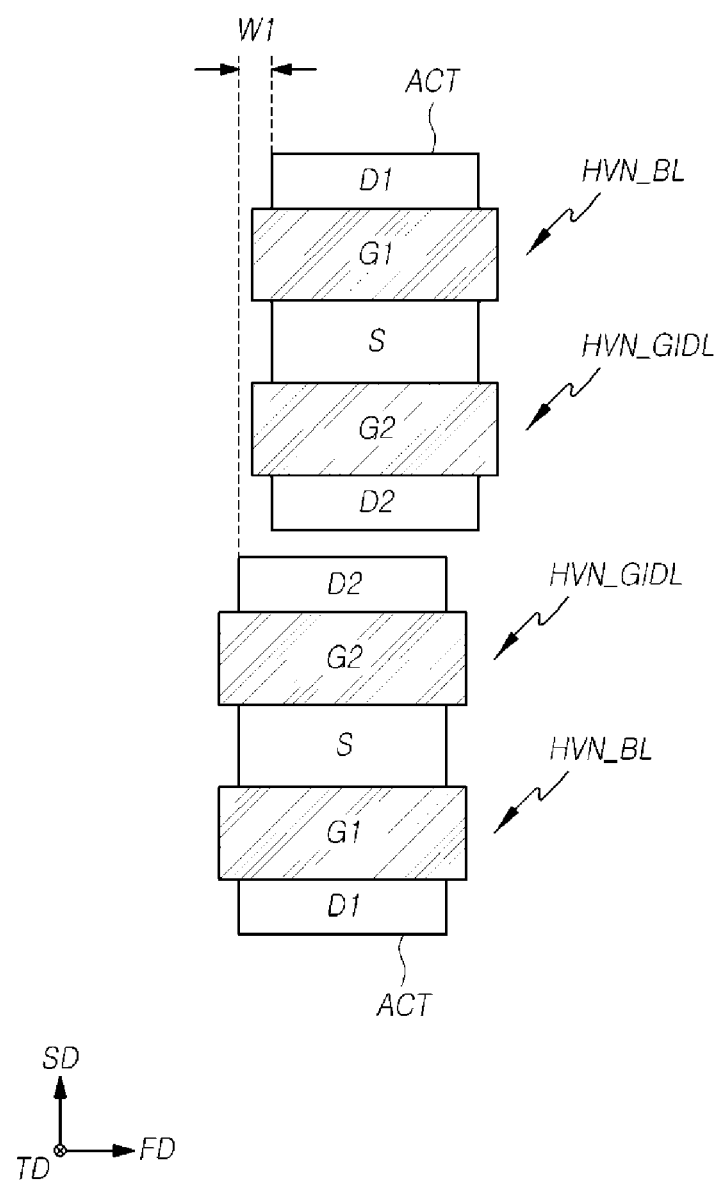
FIGS. 5A to 5C are examples of top views of the area A in FIG. 4 in accordance with embodiments of the disclosure.
Figure 5B:
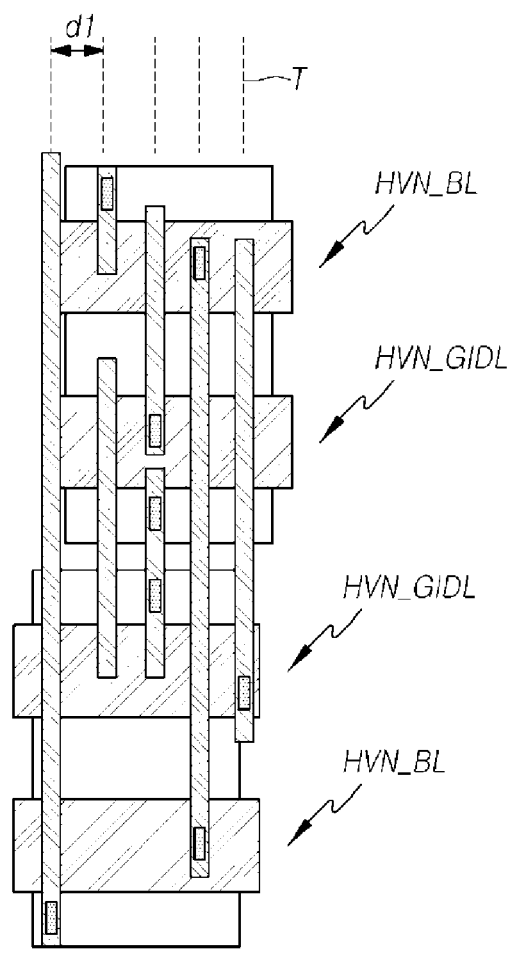
Figure 5C:
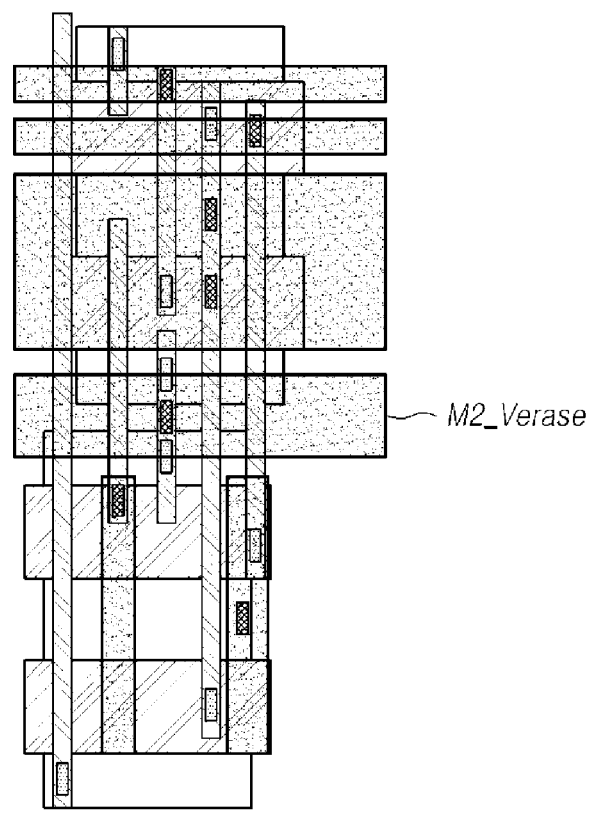

FIG. 5A is a top view illustrating an example of the transistors disposed in area A of FIG. 4. FIG. 5B is a top view in which a first wiring layer is added to FIG. 5A, and FIG. 5C is a top view in which a second wiring layer is added to FIG. 5B.

Referring to FIGS. 4 and 5A, a pair of erase bias pass transistors HVN_GIDL are disposed between a pair of bit line select transistors HVN_BL, which are disposed in and spaced apart in the second direction SD. Each of the bit line select transistors HVN_BL includes a gate G1 that traverses an active region ACT in the first direction FD, and a source region S and a drain region D1 which are defined in the active region ACT on respective or opposite sides of the gate G1. Each of the erase bias pass transistors HVN_GIDL includes a gate G2 which traverses an active region ACT in the first direction FD, and a source region S and a drain region D2 which are defined in the active region ACT on opposite sides of the gate G2. A bit line select transistor HVN_BL and an erase bias pass transistor HVN_GIDL, which are included in a single page buffer PB, are both disposed in one active region ACT and share a source region S.

Referring to FIG. 5B, first wiring lines M1 are disposed over the bit line select transistors HVN_BL and the erase bias pass transistors HVN_GIDL in the second direction SD in a first wiring layer. The first wiring lines M1 may be coupled to the gates G1, the source regions S and the drain regions D1 of the bit line select transistors HVN_BL and the gates G2, the source regions S and the drain regions D2 of the erase bias pass transistors HVN_GIDL, through first contacts CNT1.

The first wiring lines M1 are disposed in alignment with and centered on wiring line tracks T. The wiring line tracks T may be virtual lines used to illustrate the location of the first wiring lines M1 in the first wiring layer. The wiring line tracks T may extend in the second direction SD, and may be arranged in and spaced apart in the first direction FD. The distance between the wiring line tracks T in the first direction FD may be a first distance dl. The first distance dl may be determined depending on the possible degree of miniaturization in the manufacturing process.

Because the erase bias pass transistors HVN_GIDL and the bit line select transistors HVN_BL are adjacent to each other, it is not easy for the first wiring lines M1 coupled to the bit line select transistors HVN_BL and the first wiring lines M1 coupled to the erase bias pass transistors HVN_GIDL to share the wiring line tracks T.

If the wiring line tracks T are not shared, the number of wiring line tracks T required for the disposition of the first wiring lines M1 coupled to the transistors HVN_BL and HVN_GIDL exceed the number of wiring line tracks T within the width of each of the transistors HVN_BL and HVN_GIDL in the first direction FD. As illustrated in FIG. 5B, the number of wiring line tracks T required for the disposition of the first wiring lines M1 coupled to the transistors HVN_BL and HVN_GIDL is 5 which is larger than the number (4) of wiring line tracks T within the width of each of the transistors HVN_BL and HVN_GIDL in the first direction FD. As a solution, by offsetting the active regions ACT from each other by a predetermined width W1 in the first direction FD, the number of wiring line tracks T within the width of each of the transistors HVN_BL and HVN_GIDL can be made equal to or greater than the number of wiring line track required.

The erase voltage Verase is coupled in common to the drain regions D2 of the erase bias pass transistors HVN_GIDL. Therefore, it may be possible for adjacent erase bias pass transistors HVN_GIDL to share a drain region D2. If the erase bias pass transistors HVN_GIDL share a drain region D2, then the size of the semiconductor memory device may be reduced since a drain region D2 does not need to be individually configured for each of the erase bias pass transistors HVN_GIDL. However, because the active regions ACT are disposed to be shifted from each other to obtain the number of required wiring line tracks T, it is not possible for all of the erase bias pass transistors HVN_GIDL to share a drain region D2 as illustrated in FIG. 5A.

Referring to FIG. 5C, second wiring lines M2 are disposed over the first wiring layer in a second wiring layer. The second wiring lines M2 are coupled to the first wiring lines M1 through second contacts CNT2.

At least one second wiring line M2_Verase among the second wiring lines M2 is used to transfer the erase voltage Verase to the erase bias pass transistors HVN_GIDL. The erase voltage Verase may decrease in the magnitude thereof due to the load of the second wiring line M2_Verase in the process of being transferred through the second wiring line M2_Verase, and accordingly, the erase voltage Verase having a relatively low level or magnitude may be provided to the erase bias pass transistors HVN_GIDL such that an erase operation may become unstable. In order to stabilize the erase operation, the load of the second wiring line M2_Verase needs to be lowered.

In addition, if there is not enough distance between the second wiring line M2_Verase to which the erase voltage Verase can be loaded and other second wiring lines M2 adjacent thereto, then the erase voltage Verase loaded to the second wiring line M2_Verase may exert an influence on the signals or biases loaded to the other adjacent second wiring lines M2, and thereby, the operation of the semiconductor memory device may become unstable.

If the width of the second wiring line M2_Verase is increased, then the load of the second wiring line M2_Verase may be lowered. Furthermore, if the distances between the second wiring line M2_Verase and other adjacent second wiring lines M2 are increased, then the influence that is exerted by the erase voltage Verase on the signals or biases loaded to the other adjacent second wiring lines M2 may decrease. However, because the erase bias pass transistors HVN_GIDL and the bit line select transistors HVN_BL are disposed adjacent to each other, the plurality of second wiring lines M2 coupled to these transistors HVN_GIDL and HVN_BL are crowded together in the second wiring layer, and there may be no space to increase the width of the second wiring line M2_Verase or to widen the distances between the second wiring line M2_Verase and the other adjacent second wiring lines M2.

Figure 6:
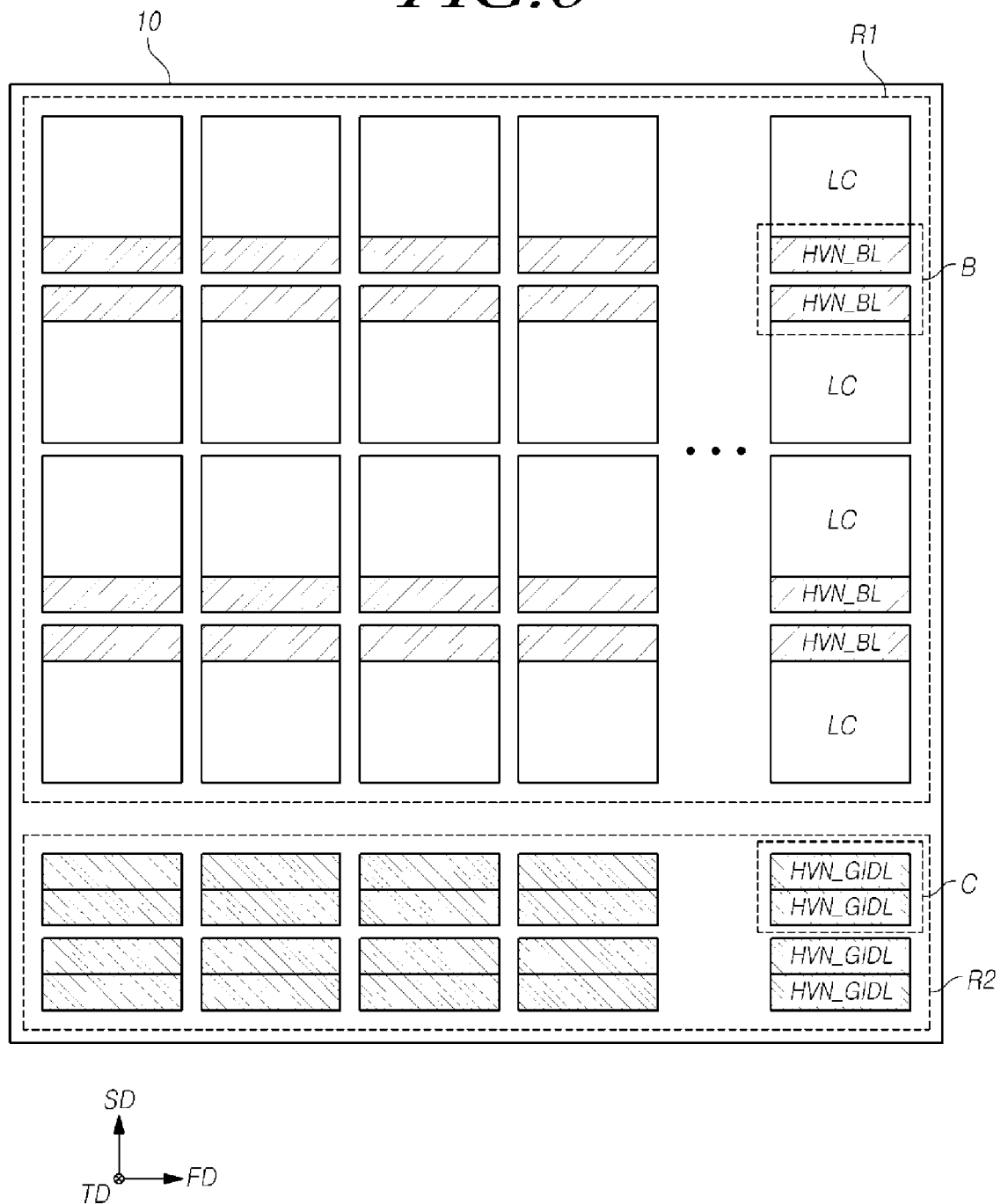
FIG. 6 is a top view illustrating an example of a page buffer circuit of a semiconductor memory device in accordance with an embodiment of the disclosure.

FIG. 6 is a top view schematically illustrating an example of the layout of a page buffer circuit of a semiconductor memory device in accordance with an embodiment of the disclosure.

Referring to FIG. 6, a substrate 10 may include a first region R1 and an adjacent second region R2. Latches LC and bit line select transistors HVN_BL may be disposed in the first region R1, while erase bias pass transistors HVN_GIDL may be disposed in the second region R2.

Rather than in staggered rows, latches LC and adjacent bit line select transistors HVN_BL may be disposed substantially in the form of a matrix having a plurality of columns, and rows (e.g., four rows) that are parallel to the first direction and spaced apart in the second direction SD. The bit line select transistors HVN_BL may be disposed between two adjacent rows of the latches LC. The bit line select transistors HVN_BL may be disposed in two rows between two adjacent rows of the latches LC. A pair of bit line select transistors HVN_BL may be disposed adjacent to each other between a pair of latches LC which are adjacent to each other in the second direction SD. A row of the latches LC may be disposed at or near the edge of the first region R1 that is adjacent to the second region R2, with the associated bit line select transistors HVN_BL positioned away from the edge.

In the second region R2, the erase bias pass transistors HVN_GIDL may be disposed in the form of a matrix having columns and a plurality of rows (e.g., four rows) extending in the second direction SD. In a pair of rows of erase bias pass transistors HVN_GIDL, the transistors may be adjacent to each other in the second direction SD while being spaced apart in the first direction FD. There may be a space between pairs of rows of erase bias pass transistors HVN_GIDL. The erase bias pass transistors HVN_GIDL may be adjacent to the row of the latches LC which are disposed at or near the edge of the first region R1. The erase bias pass transistors HVN_GIDL are not adjacent to the bit line select transistors HVN_BL.

Figure 7A:
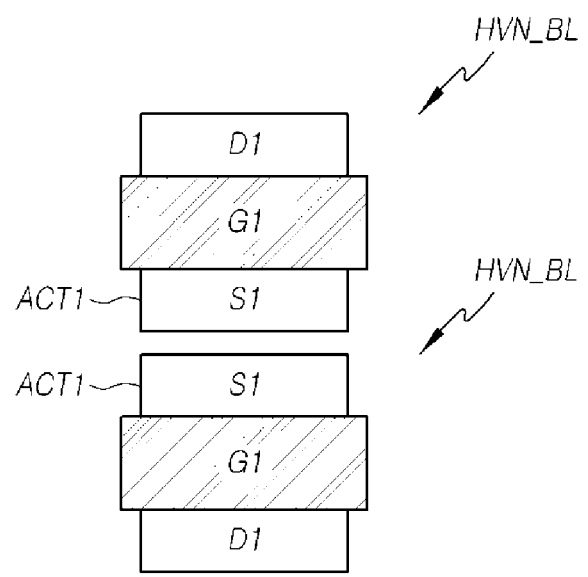
FIGS. 7A to 7C are examples of top views of a configuration of area B of FIG. 6 in accordance with embodiments of the disclosure.
Figure 7A:
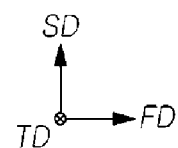
Figure 7B:
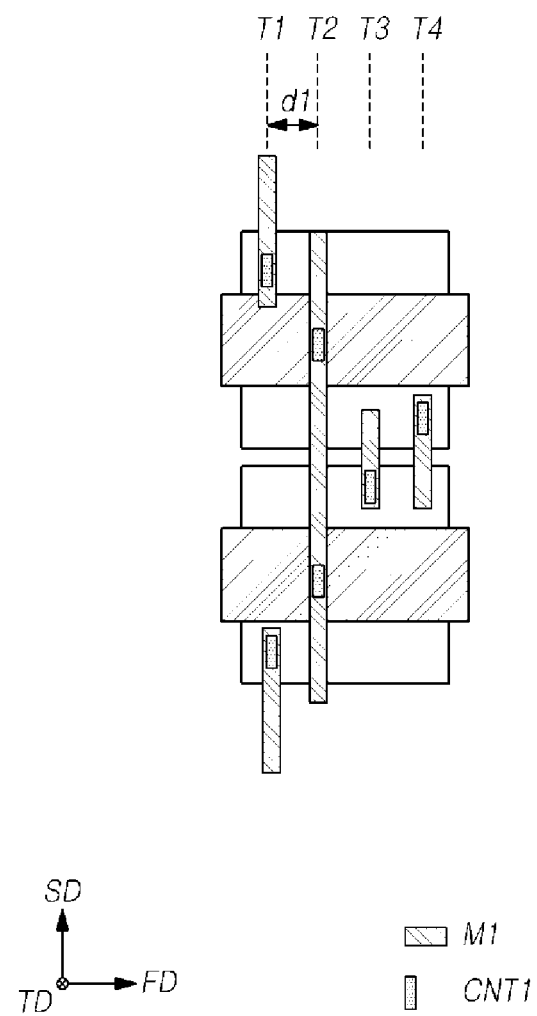
Figure 7C:
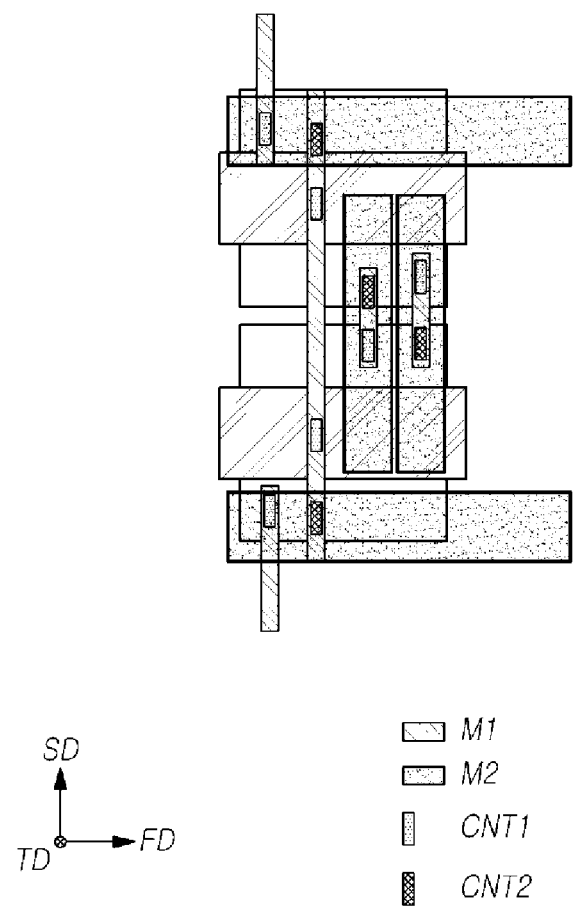
Figure 8A:
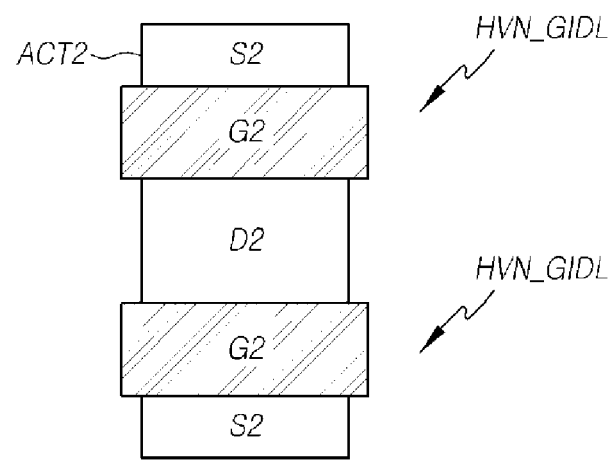
FIGS. 8A to 8C are examples of top views of a configuration of area C of FIG. 6 in accordance with embodiments of the disclosure.
Figure 8A:
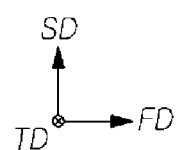
Figure 8B:
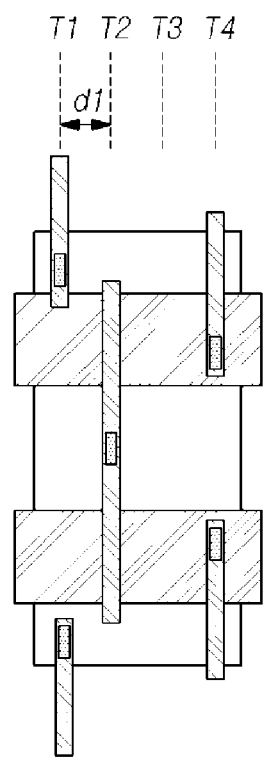
Figure 8C:
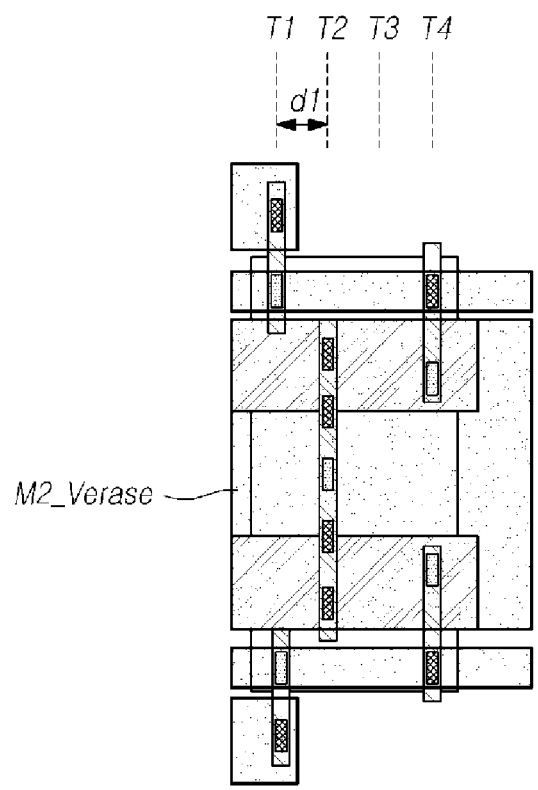
Figure 8C:
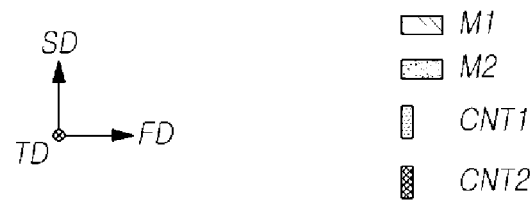

FIG. 7A is a top view illustrating an example of transistors disposed in area B of FIG. 6. FIG. 7B is a top view in which a first wiring layer is added to the structure illustrated in FIG. 7A. FIG. 7C is a top view in which a second wiring layer is added to the structure illustrated in FIG. 7B. FIG. 8A is a top view illustrating an example of transistors disposed in area C of FIG. 6. FIG. 8B is a top view in which a first wiring layer is added to the structure illustrated in FIG. 8A. FIG. 8C is a top view in which a second wiring layer is added to the structure illustrated in FIG. 8B.

Referring to FIGS. 6 and 7A, a pair of bit line select transistors HVN_BL may be disposed between a pair of latches LC disposed in the second direction SD in the first region R1. Bit line select transistors HVN_BL are adjacent to each other in the second direction SD. Each of the bit line select transistors HVN_BL may be configured to include a gate G1, which traverses an active region ACT1 in the first direction FD, and a source region S1 and a drain region D1, which are defined in the active region ACT1 on respective sides of the gate G1.

In the interval or space (in the second direction SD) between the pair of latches LC, only the pair of bit line select transistors HVN_BL are disposed, and erase bias pass transistors HVN_GIDL are not disposed.

Referring to FIG. 7B, first wiring lines M1 may be disposed over the bit line select transistors HVN_BL in a first wiring layer. The first wiring lines M1 may be coupled to the gates G1, the source regions S1 and the drain regions D1 of the bit line select transistors HVN_BL through first contacts CNT1.

A plurality of substantially parallel wiring line tracks T1 to T4 span the width of the bit line select transistors HVN_BL in the first direction FD. In the interval between the pair of latches LC, only a pair of bit line select transistors HVN_BL are disposed and erase bias pass transistors HVN_GIDL are not disposed. Therefore, only the first wiring lines M1 coupled to the bit line select transistors HVN_BL may be disposed in the first wiring layer in the interval, and first wiring lines M1 coupled to the erase bias pass transistors HVN_GIDL may not be disposed at the first wiring layer in the interval. Therefore, first region R1 has comparatively fewer first wiring lines M1 disposed than in the comparative example described above with reference to FIG. 5B, and all the first wiring lines M1 may be disposed in alignment with the wiring line tracks T1 to T4 within first region R1 and no additional wiring line tracks are necessary.

Referring to FIG. 7C, second wiring lines M2 may be disposed over the first wiring layer in a second wiring layer. The second wiring lines M2 may be coupled to the first wiring lines M1 through second contacts CNT2.

As discussed above, in the interval between the pair of latches LC, only a pair of bit line select transistors HVN_BL are disposed and erase bias pass transistors HVN_GIDL are not disposed. Therefore, only the second wiring lines M2 coupled to the bit line select transistors HVN_BL may be disposed in the second wiring layer in the interval, and second wiring lines M2 coupled to the erase bias pass transistors HVN_GIDL may not be disposed at the second wiring layer in the interval. Therefore, first region R1 has comparatively fewer second wiring lines M2 disposed in the interval than in the comparative example described above with reference to FIG. 5C, and the width of the second wiring lines M2, as well as the distance between the second wiring lines M2, may be increased.

Referring to FIGS. 6 and 8A, the erase bias pass transistors HVN_GIDL are disposed in the second region R2 to be adjacent to each other in the second direction SD. Each of the erase bias pass transistors HVN_GIDL may be configured to include a gate G2, which traverses an active region ACT2 in the first direction FD, and a source region S2 and a drain region D2, which are defined in the active region ACT2 on respective sides of the gate G2. The source regions S2 of the erase bias pass transistors HVN_GIDL may be coupled to different bit lines, respectively. The drain regions D2 of the erase bias pass transistors HVN_GIDL may be coupled in common to an erase voltage. A pair of erase bias pass transistors HVN_GIDL adjacent to each other in the second direction SD may be disposed in the single active region ACT2, and may share the drain region D2.

Referring to FIG. 8B, first wiring lines M1 may be disposed over the erase bias pass transistors HVN_GIDL in a first wiring layer. The first wiring lines M1 may be coupled to the gates G2, the source regions S2 and the drain regions D2 of the erase bias pass transistors HVN_GIDL through first contacts CNT1.

A plurality of substantially parallel wiring line tracks T1 to T4 may span the width of the erase bias pass transistors HVN_GIDL in the first direction FD. In the second region R2, only erase bias pass transistors HVN_GIDL are disposed and bit line select transistors HVN_BL are not disposed. Therefore, only the first wiring lines M1 coupled to the erase bias pass transistors HVN_GIDL may be disposed in the first wiring layer in the second region R2, and first wiring lines M1 coupled to bit line select transistors HVN_BL may not be disposed in the first wiring layer in the second region R2. Therefore, second region R2 has comparatively fewer first wiring lines M1 span corresponding pairs of erase bias pass transistors HVN_GIDL in the second direction SD than in the comparative example described above with reference to FIG. 5B. Thus, all of the first wiring lines M1 may be disposed in alignment with wiring line tracks T1 to T4 within second region R2 and no additional wiring line tracks are necessary. Therefore, since it is not necessary to shift active regions relative to each other in the first direction in order to obtain the number of required wiring line tracks, the erase bias pass transistors HVN_GIDL, which are adjacent to each other in the second direction SD, may be disposed in a single active region ACT2, and may share a drain region D2. Therefore, when compared to a case where the erase bias pass transistors HVN_GIDL do not share the drain region D, it is possible to reduce the size of the semiconductor memory device by positioning erase bias pass transistors HVN_GIDL in a separate region on the substrate.

Referring to FIG. 8C, second wiring lines M2 may be disposed at a second wiring layer over the first wiring layer. The second wiring lines M2 may be coupled to the first wiring lines M1 through second contacts CNT2.

As discussed above, in the second region R2, only the erase bias pass transistors HVN_GIDL are disposed and bit line select transistors HVN_BL are not disposed, only the second wiring lines M2 coupled to the erase bias pass transistors HVN_GIDL may be disposed in the second wiring layer in the second region R2, and second wiring lines M2 coupled to bit line select transistors HVN_BL may not be disposed at the second wiring layer in the second region R2. Therefore, first region R1 has comparatively fewer second wiring lines M2 that span pairs of erase bias pass transistors HVN_GIDL that are adjacent to each other in the second direction SD than in the comparative example described above with reference to FIG. 5C. As a result, the width of the second wiring lines M2 coupled to the erase bias pass transistors HVN_GIDL, and the distance between the second wiring lines M2, may be increased. Since the width of a second wiring line M2_Verase used to transfer an erase voltage to the erase bias pass transistors HVN_GIDL may be widened, the erase voltage may be suppressed from decreasing in its magnitude while being transferred to the erase bias pass transistors HVN_GIDL through the second wiring line M2_Verase, thereby stabilizing an erase operation. In addition, since the distance between the second wiring line M2_Verase to which the erase voltage having a relatively high level is loaded and other adjacent second wiring lines M2 may be increased, the interference caused by the erase voltage loaded to the second wiring line M2_Verase and the signals or biases loaded to the other adjacent second wiring lines M2 may be reduced, thereby improving the operating characteristics of the semiconductor memory device. In short, by increasing the width of wiring lines and the interval between the wiring lines, without increasing the size of a semiconductor memory device to reduce the load of the wiring lines and the interference between the wiring lines, it is possible to provide a semiconductor memory device having improved operating characteristics without sacrificing size.

Figure 9:
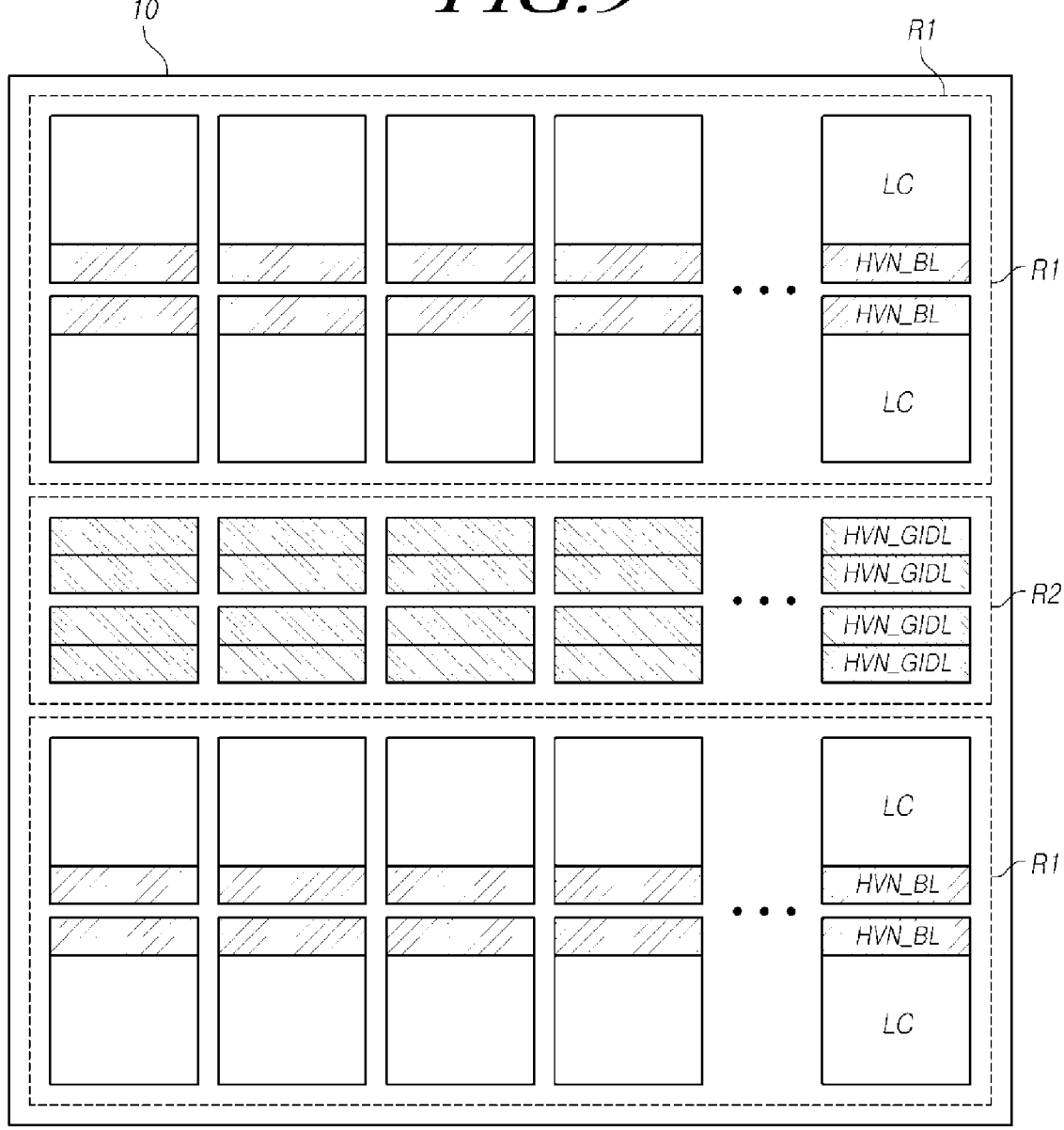
FIGS. 9 and 10 are top views illustrating examples of schematic layouts of page buffer circuits of semiconductor memory devices in accordance with embodiments of the disclosure.

FIG. 9 is a top view schematically illustrating an example of a layout of page buffer circuits of a semiconductor memory device in accordance with an embodiment of the disclosure.

Referring to FIG. 9, two first regions R1 and one second region R2 may be defined in a substrate 10 in the second direction SD, which corresponds to the direction in which the bit lines BL extend. The first regions R1 may be disposed in and spaced apart in the second direction SD, and the second region R2 may be disposed between the first regions R1.

Latches LC and bit line select transistors HVN_BL may be disposed in the first regions R1. In each of the first regions R1, the latches LC and adjacent bit line select transistors HVN_BL may be disposed substantially in the form of a matrix having a plurality of columns and rows (for example, two rows) that are parallel to the first direction and spaced apart in the second direction SD. The bit line select transistors may be disposed between two adjacent rows of the latches LC. Two rows of the bit line select transistors HVN_BL may be disposed between the two adjacent rows of the latches LC. A pair of bit line select transistors HVN_BL may be disposed adjacent to each other between a pair of latches LC adjacent to each other in the second direction SD. A row of the latches LC may be disposed at or near an edge of each of the first regions R1 which is adjacent to the second region R2, with the associated bit line select transistors HVN_BL positioned away from the edge.

Erase bias pass transistors HVN_GIDL may be disposed in the second region R2. The erase bias pass transistors HVN_GIDL may be disposed in the form of a matrix having columns and a plurality of rows (e.g., four rows) extending in the second direction SD. In a pair of rows of erase bias pass transistors HVN_GIDL, the transistors may be adjacent to each other in the second direction SD while being spaced apart in the first direction FD. The erase bias pass transistors HVN_GIDL disposed at or near both edges of the second region R2 in the second direction SD may be adjacent to the rows of the latches LC disposed at or near the edges of the first regions R1. The erase bias pass transistors HVN_GIDL are not adjacent to the bit line select transistors HVN_BL.

Figure 10:
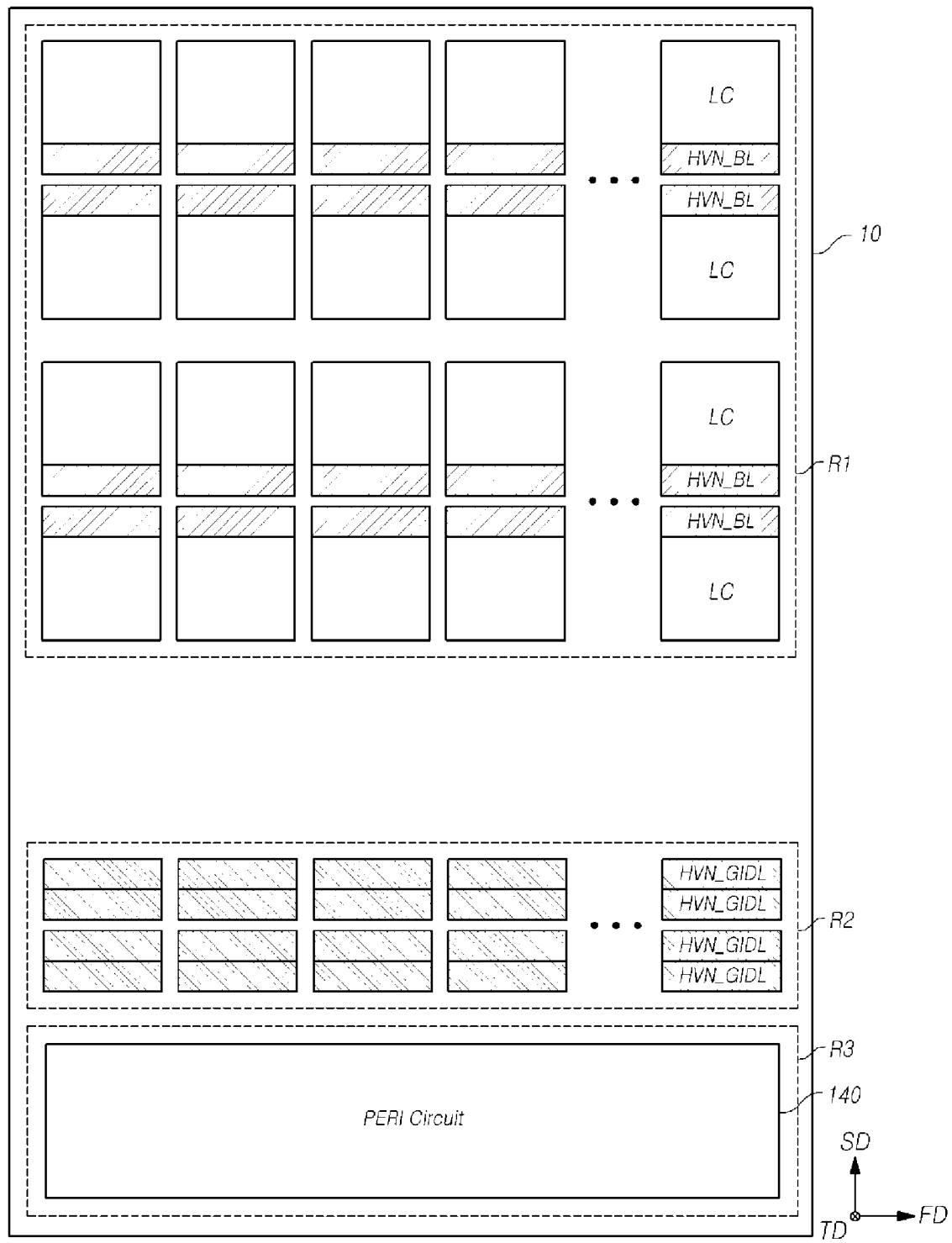

FIG. 10 is a top view schematically illustrating an example of the layout of page buffer circuits of a semiconductor memory device in accordance with an embodiment of the disclosure.

Referring to FIG. 10, a first region R1, a second region R2 and a third region R3 may be defined on a substrate 10 in the second direction SD, which is the direction bit lines BL also extend. The second region R2 may be adjacent to the third region R3. The second region R2 may be spaced apart from the first region R1 by a predetermined interval.

Latches LC and bit line select transistors HVN_BL may be disposed in the first region R1. The latches LC and adjacent bit line select transistors HVN_BL may be disposed in the form of a matrix having columns, and a plurality of rows (e.g., four rows) that are parallel to the first direction and spaced apart in the second direction SD. Bit line select transistors HVN_BL may be disposed between each two adjacent rows of the latches LC. The bit line select transistors HVN_BL may be disposed in two rows between two adjacent rows of the latches LC. A pair of bit line select transistors HVN_BL may be disposed between a pair of latches LC adjacent to each other in the second direction SD.

Erase bias pass transistors HVN_GIDL may be disposed in the second region R2. The erase bias pass transistors HVN_GIDL may be disposed in the form of a matrix having columns and a plurality of rows (e.g., four rows) extending in the second direction SD. In a pair of rows of erase bias pass transistors HVN_GIDL, the transistors may be adjacent to each other in the second direction SD while being spaced apart in the first direction FD. The bit line select transistors HVN_BL and the erase bias pass transistors HVN_GIDL are not adjacent to each other. A peripheral circuit 140 may be disposed in the third region R3. That is, the erase bias pass transistors HVN_GIDL may be disposed adjacent to the third region R3 in which the peripheral circuit 140 is positioned.

Figure 11:
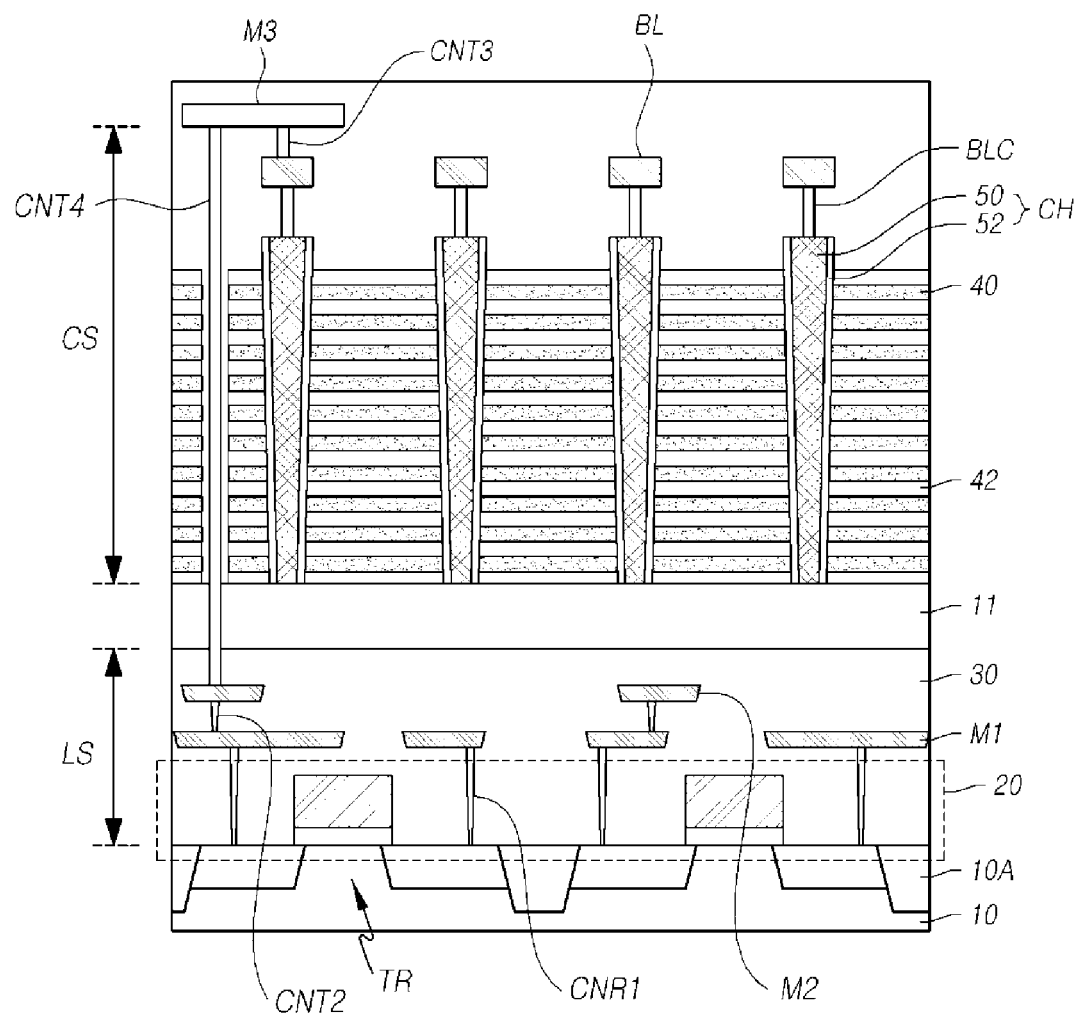
FIGS. 11 and 12 are cross-sectional views illustrating examples of semiconductor memory devices in accordance with embodiments of the disclosure.

FIG. 11 is a cross-sectional view illustrating an example of a portion of a semiconductor memory device in accordance with an embodiment of the disclosure.

Referring to FIG. 11, a semiconductor memory device may have a PUC (peri under cell) structure. A logic structure LS may be disposed under a memory structure CS.

The logic structure LS may be disposed on a substrate 10. The memory structure CS may be disposed on a source plate 11. The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The source plate 11 may be constituted by a polysilicon layer. Unlike the substrate 10, which may use a monocrystalline silicon layer, the source plate 11, which is formed on the logic structure LS, may be constituted by a polysilicon layer.

The logic structure LS may include a logic circuit 20, wiring lines M1 and M2, and a dielectric layer 30. The logic circuit 20 may include transistors TR which are disposed on active regions of the substrate 10 defined by isolation layer 10A. While not illustrated, the logic circuit 20 may further include capacitors, inductors, and so forth. The logic circuit 20 may include a page buffer circuit which has a structure in embodiments described above with reference to FIGS. 6 to 10.

The dielectric layer 30 may be disposed on the substrate 10 to cover the logic circuit 20. The dielectric layer 30 may include silicon oxide, for example, HDP (high density plasma) oxide or TEOS (tetra-ethyl-ortho-silicate) oxide. The plurality of wiring lines M1 and M2 may be disposed in the dielectric layer 30. The wiring lines M1 and M2 may include first wiring lines M1 which are disposed in a first wiring layer over the logic circuit 20, and second wiring lines M2 disposed in a second wiring layer over the first wiring layer. The first wiring lines M1 may be coupled to the logic circuit 20 through first contacts CNT1. The second wiring lines M2 may be coupled to the first wiring lines M1 through second contacts CNT2.

The memory structure CS may include vertical channels CH, which are disposed on the source plate 11, a plurality of electrode layers 40 and a plurality of interlayer dielectric layers 42. The plurality of electrode layers 40 and the plurality of interlayer dielectric layers 42 are alternately stacked along the vertical channels CH.

Among the electrode layers 40, one or more from the lowest layer may constitute a source select line, and one or more from the uppermost layer may constitute a drain select line. The electrode layers 40 between the source select line and the drain select line may constitute word lines. The electrode layers 40 may include a conductive material. For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may include silicon oxide.

The vertical channels CH may be coupled to the source plate 11 through the electrode layers 40 and the interlayer dielectric layers 42. Each of the vertical channels CH may include a channel layer 50 and a gate dielectric layer 52. The channel layer 50 may include polysilicon or monocrystalline silicon, and may include a P-type impurity such as boron (B) that is localized in some areas thereof. The gate dielectric layer 52 may include a tunnel dielectric layer, a charge storage layer and a blocking layer which are sequentially stacked in an inward direction from the outer sidewall of the channel layer 50. The tunnel dielectric layer may include silicon oxide, hafnium oxide, aluminum oxide, zirconium oxide or tantalum oxide. The charge storage layer may include silicon nitride, boron nitride, silicon boron nitride or polysilicon doped with an impurity. The blocking layer may include a single layer or a stack layer of silicon oxide, silicon nitride, hafnium oxide, aluminum oxide, zirconium oxide and tantalum oxide. In some embodiments, the gate dielectric layer 52 may have an ONO (oxide-nitride-oxide) stack structure in which an oxide layer, a nitride layer and an oxide layer are sequentially stacked. The disclosed structures may include source select transistors, memory cells and drain select transistors formed in areas in which the electrode layers 40 surround the vertical channels CH.

Bit lines BL may be disposed over the vertical channels CH and the alternately stacked electrode layers 40 and the interlayer dielectric layers 42. The bit lines BL may be coupled to the channel layers 50 of the vertical channels CH through bit line contacts BLC. The bit lines BL may extend in the second direction SD, and may be disposed in the first direction FD. Wiring lines M3 may be disposed over the bit lines BL. The wiring lines M3 may be coupled to the bit lines BL through contacts CNT3. The wiring lines M3 may be coupled to the wiring lines M2 of the logic structure LS through contacts CNT4. The wiring lines M3 may provide electrical paths which couple the bit lines BL and the logic circuit 20 of the logic structure LS. Portions of the logic circuit 20 which are coupled to the bit lines BL may correspond to a page buffer circuit.

Figure 12:
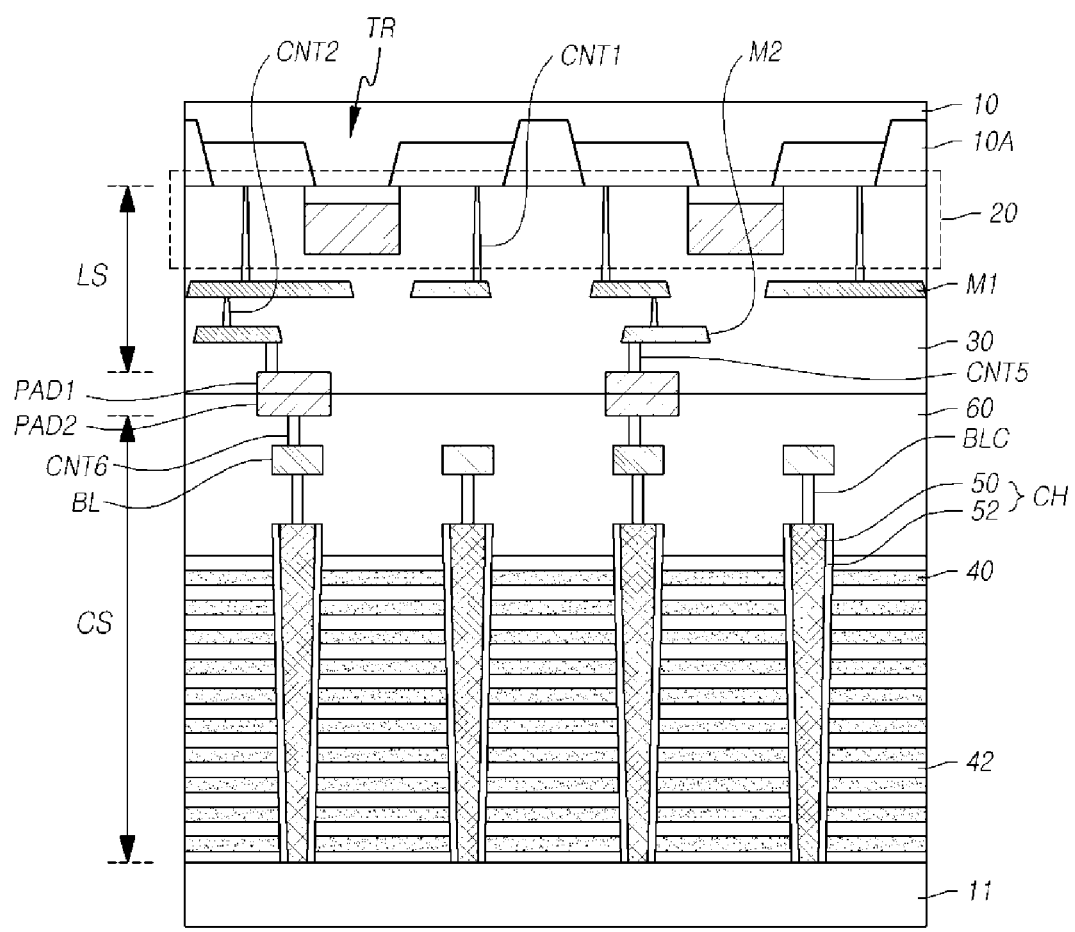
Figure 12:
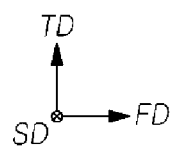

FIG. 12 is a cross-sectional view illustrating an example of a portion of a semiconductor memory device in accordance with an embodiment of the disclosure.

Referring to FIG. 12, the semiconductor memory device may have a POC (peri over cell) structure. A logic structure LS may be disposed over a memory structure CS.

The memory structure CS and the logic structure LS may be separately fabricated and be then bonded with each other. The memory structure CS may be fabricated on a source plate 11. The logic structure LS may be fabricated on a substrate 10. The substrate 10 and the source plate 11 may be formed of the same material. The substrate 10 and the source plate 11 may each include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic structure LS may include a plurality of first pads PAD1 on a one surface thereof. The memory structure CS may include a plurality of second pads PAD2 on a one surface thereof. The first pads PAD1 may be coupled to a logic circuit 20 through contacts CNT5, second wiring lines M2, contacts CNT2, first wiring lines M1 and contacts CNT1. The second pads PAD2 may be coupled to bit lines BL through contacts CNT6. As the one surface of the logic structure LS and the one surface of the memory structure CS are bonded with each other, the first pads PAD1 and the second pads PAD2 may be coupled with each other. Therefore, electrical paths couple the bit lines BL and the logic circuit 20 of the logic structure LS. Portions of the logic circuit 20 which are coupled to the bit lines BL may correspond to a page buffer circuit.

As is apparent from the above descriptions, according to the embodiments of the disclosure, the width of wiring lines and the interval between the wiring lines may be increased without increasing a layout area, thereby reducing the loading of the wiring lines and the interference between the wiring lines. Further, since a drain region may be shared between erase bias pass transistors, the area occupied by the erase bias pass transistors may be reduced, whereby the size of a semiconductor memory device may be reduced.

Figure 13:
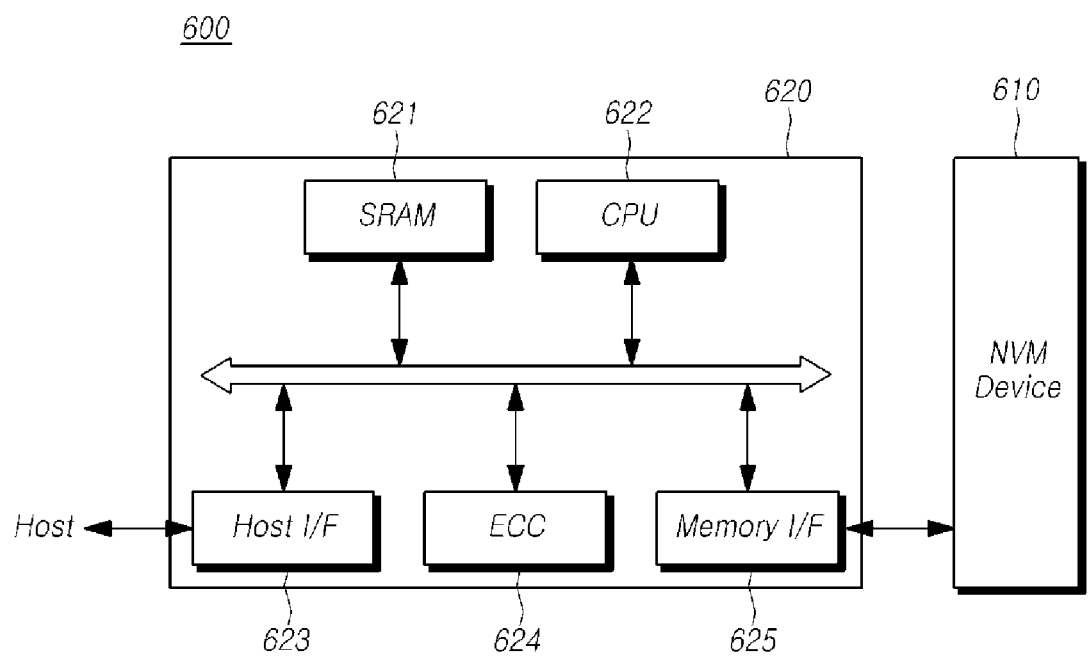
FIG. 13 is a diagram schematically illustrating a memory system including a semiconductor memory device in accordance with an embodiment of the disclosure.

FIG. 13 is a block diagram schematically illustrating an example of a memory system including a semiconductor memory device in accordance with an embodiment of the disclosure.

Referring to FIG. 13, a memory system 600 in accordance with an embodiment of the disclosure may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips. The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 14:
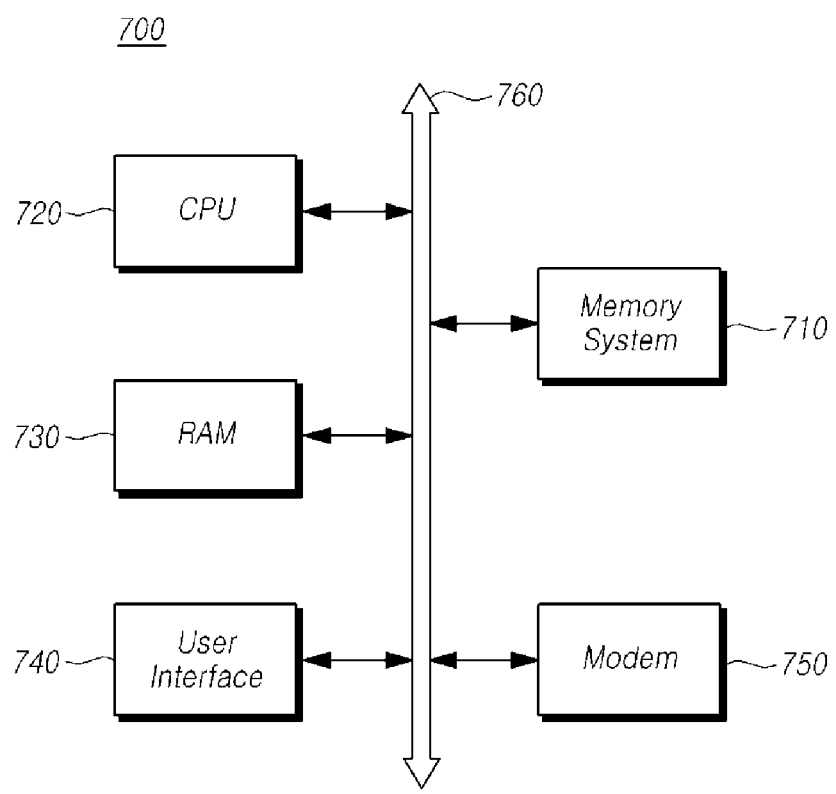
FIG. 14 is a block diagram schematically illustrating a computing system including a semiconductor memory device in accordance with an embodiment of the disclosure.

FIG. 14 is a block diagram schematically illustrating an example of a computing system including a semiconductor memory device in accordance with an embodiment of the disclosure.

Referring to FIG. 14, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
a memory cell array; and
a page buffer circuit coupled to the memory cell array through a plurality of bit lines which extend in a second direction intersecting with a first direction,
the page buffer circuit comprising:
a plurality of bit line select transistors coupled to the plurality of bit lines;
a plurality of latches coupled to the plurality of bit line select transistors; and
a plurality of erase bias pass transistors coupled to the plurality of bit lines, and configured to transfer an erase voltage to the plurality of bit lines,
wherein the plurality of erase bias pass transistors and the plurality of bit line select transistors are disposed in different regions, and are not adjacent to each other.

2. The semiconductor memory device according to claim 1,
wherein the plurality of bit line select transistors and the plurality of latches are disposed in a first region, the plurality of the erase bias pass transistors are disposed in a second region,
wherein the first region and the second region are adjacent to each other in the second direction.

3. The semiconductor memory device according to claim 2, wherein an edge of the second region is adjacent to an edge of the first region.

4. The semiconductor memory device according to claim 3,
wherein the plurality of latches are disposed in the form of a matrix having a plurality of rows in the second direction, and a plurality of columns in the first direction, wherein two rows of the plurality of bit line select transistors are disposed between two adjacent rows of the latches, and
wherein a row of the latches is disposed at the edge of the first region which is adjacent to the edge of the second region.

5. The semiconductor memory device according to claim 1, wherein the plurality of bit line select transistors and the plurality of latches are disposed in a first region, the plurality of erase bias pass transistors are disposed in a second region, and the second region is adjacent to a third region in which a peripheral circuit for controlling the page buffer circuit is positioned.

6. The semiconductor memory device according to claim 1, wherein the plurality of bit line select transistors and the plurality of latches are disposed in a pair of first regions which are disposed in the second direction, and the plurality of erase bias pass transistors are disposed in a second region between the first regions.

7. The semiconductor memory device according to claim 6,
wherein the plurality of latches are disposed in the form of a matrix having a plurality of rows in the second direction and a plurality of columns in the first direction, and the plurality of bit line select transistors are disposed between two adjacent rows of the latches, and
wherein rows of the plurality of latches are disposed at edges of the first regions which are adjacent to the second region.

8. The semiconductor memory device according to claim 1, wherein the plurality of erase bias pass transistors are disposed in the form of a matrix having a plurality of rows in the second direction and a plurality of columns in the first direction, and are adjacent to each other in the first direction and the second direction.

9. The semiconductor memory device according to claim 8,
wherein each of the plurality of erase bias pass transistors includes a drain region which is coupled with the erase voltage, a source region which is coupled with one of a plurality of bit lines, and a gate which is disposed between the source region and the drain region, and
wherein a pair of erase bias pass transistors which are adjacent to each other in the second direction share a drain region.

10. A semiconductor memory device comprising:
a page buffer circuit disposed on a substrate; and
a memory cell array disposed on a source plate over the page buffer circuit, and coupled to the page buffer circuit through a plurality of bit lines extending in a second direction intersecting with a first direction,
the page buffer circuit comprising:
a plurality of bit line select transistors coupled to the bit lines;
a plurality of latches coupled to the plurality of bit line select transistors; and
a plurality of erase bias pass transistors coupled to the plurality of bit lines, and configured to transfer an erase voltage to the bit lines,
wherein the plurality of erase bias pass transistors and the plurality of bit line select transistors are disposed on the substrate in different regions, and are not adjacent to each other.

11. The semiconductor memory device according to claim 10,
wherein the substrate includes a first region and a second region which are disposed in the second direction, and
wherein the plurality of latches and the plurality of bit line select transistors are disposed in the first region, and the plurality of erase bias pass transistors are disposed in the second region.

12. The semiconductor memory device according to claim 11,
wherein the plurality of latches are disposed in the form of a matrix having a plurality of rows in the second direction, and the bit line select transistors are disposed between two adjacent rows of the latches, and
wherein a row of the latches is disposed at an edge of the first region which is adjacent to an edge of the second region.

13. The semiconductor memory device according to claim 11, wherein the plurality of erase bias pass transistors are disposed in the form of a matrix having a plurality of rows in the second direction, and are adjacent to each other in the first direction and the second direction.

14. The semiconductor memory device according to claim 13,
wherein each of the plurality of erase bias pass transistors includes a drain region which is coupled with the erase voltage, a source region which is coupled with a bit line, and a gate which is disposed between the source region and the drain region, and
wherein a pair of erase bias pass transistors which are adjacent to each other in the second direction share a drain region.

15. The semiconductor memory device according to claim 10,
wherein the substrate includes a first region, a second region and a third region which are disposed in the second direction, and
wherein the plurality of bit line select transistors and the plurality of latches are disposed in the first region, the plurality of erase bias pass transistors are disposed in the second region, a peripheral circuit which controls the page buffer circuit is disposed in the third region, and the second region and the third region are adjacent to each other.

16. A semiconductor memory device comprising:
a cell wafer including a memory cell array, and first pads which are coupled to the memory cell array through a plurality of bit lines extending in a second direction intersecting with a first direction; and
a peripheral wafer including a page buffer circuit and second pads which are coupled to the page buffer circuit, and bonded onto the cell wafer such that the second pads are coupled with the first pads,
the page buffer circuit comprising:
a plurality of bit line select transistors coupled to the a plurality of bit lines;
a plurality of latches coupled to the plurality of bit line select transistors; and
a plurality of erase bias pass transistors coupled to the plurality of bit lines, and configured to transfer an erase voltage to respective bit lines in an erase operation,
wherein the plurality of erase bias pass transistors and the plurality of bit line select transistors are disposed in different regions, and are not adjacent to each other.

17. The semiconductor memory device according to claim 16,
wherein the peripheral wafer includes a first region and a second region which are disposed in the second direction, and
wherein the plurality of latches and the plurality of bit line select transistors are disposed in the first region, and the plurality of erase bias pass transistors are disposed in the second region.

18. The semiconductor memory device according to claim 17,
wherein the plurality of latches are disposed in the form of a matrix having a plurality of rows in the second direction, and the plurality of bit line select transistors are disposed between two adjacent rows of the latches, and
wherein a row of the latches is disposed at an edge of the first region which is adjacent to an edge of the second region.

19. The semiconductor memory device according to claim 17, wherein the plurality of erase bias pass transistors are disposed in the form of a matrix having a plurality of rows in the second direction, and are adjacent to each other in the first direction and the second direction.

20. The semiconductor memory device according to claim 19,
wherein each of the plurality of erase bias pass transistors includes a drain region which is coupled with the erase voltage, a source region which is coupled with a bit line, and a gate which is disposed between the source region and the drain region, and
wherein a pair of erase bias pass transistors which are adjacent to each other in the second direction share a drain region.

* * * * *